United States Patent
Igarashi et al.

(10) Patent No.: US 11,079,445 B2
(45) Date of Patent: Aug. 3, 2021

(54) TERMINAL STATE MEASUREMENT DEVICE FOR COAXIAL CABLE

(71) Applicants: Yazaki Corporation, Tokyo (JP); JAPAN CHAIN TERMINAL CO., LTD., Tendo (JP)

(72) Inventors: Shingo Igarashi, Tendo (JP); Yoshihiro Ito, Tendo (JP)

(73) Assignees: YAZAKI CORPORATION, Tokyo (JP); JAPAN CHAIN TERMINAL CO., LTD., Tendo (JP)

( * ) Notice: Subject to any disclaimer, the term of this patent is extended or adjusted under 35 U.S.C. 154(b) by 204 days.

(21) Appl. No.: 16/558,475

(22) Filed: Sep. 3, 2019

(65) Prior Publication Data

US 2020/0072890 A1    Mar. 5, 2020

(30) Foreign Application Priority Data

Sep. 4, 2018 (JP) .............................. JP2018-165420

(51) Int. Cl.
*G01R 31/69* (2020.01)
*G01R 31/12* (2020.01)

(52) U.S. Cl.
CPC ............. *G01R 31/69* (2020.01); *G01R 31/12* (2013.01)

(58) Field of Classification Search
CPC .... G01R 31/69; G01R 31/12; G01R 31/1263; G01R 31/1272; G01R 31/50; G01R 31/083
USPC .................................................. 324/538–545
See application file for complete search history.

(56) References Cited

U.S. PATENT DOCUMENTS

| | | | | |
|---|---|---|---|---|
| 5,614,820 A | * | 3/1997 | Aoyama | G01R 31/69 324/754.14 |
| 5,795,531 A | * | 8/1998 | Salzmann | G01B 15/00 264/408 |
| 6,057,510 A | * | 5/2000 | Acke | H01R 9/05 174/84 R |
| 6,308,430 B1 | * | 10/2001 | Itaya | G01R 31/69 33/645 |
| 2003/0224656 A1 | | 12/2003 | Yoshida | |
| 2013/0300429 A1 | * | 11/2013 | Jefferies | B60L 53/31 324/511 |

(Continued)

FOREIGN PATENT DOCUMENTS

JP       2003-297493 A      10/2003

*Primary Examiner* — Jeff W Natalini
(74) *Attorney, Agent, or Firm* — Sughrue Mion, PLLC

(57) ABSTRACT

A terminal state measurement device for a coaxial cable includes: a conductive cylindrical body which comes close to a front end edge of an outer conductor terminal to bring a front end face of the conductive cylindrical body into contact with the front end edge when the outer conductor terminal is connected to a coaxial cable; a conduction measurement element displaceable with respect to the conductive cylindrical body in an axial direction, and which contacts a front end of an inner conductor terminal from the front side to displace in the axial direction in accordance with an insertion position of the inner conductor terminal; a displacement measurement device which measures a position of the front end of the inner conductor terminal; and an insulation determination unit which determines an insulation quality based on a conduction state of the conduction measurement element and the conductive cylindrical body.

3 Claims, 13 Drawing Sheets

(56) References Cited

U.S. PATENT DOCUMENTS

2016/0041228 A1\* 2/2016 Gerada .................... H02K 3/28
                                                324/765.01

\* cited by examiner

TERMINAL STATE MEASUREMENT DEVICE FOR COAXIAL CABLE

CROSS REFERENCE TO RELATED APPLICATIONS

This application is based on and claims priority from Japanese patent application No. 2018-165420 filed on Sep. 4, 2018, the entire contents of which are incorporated herein by reference.

BACKGROUND OF THE INVENTION

1. Technical Field

The present invention relates to a terminal state measurement device for a coaxial cable which is configured to measure a mutual relationship between an inner conductor terminal connected to an inner conductor of a coaxial cable and an outer conductor terminal connected to an outer conductor of the coaxial cable when the inner conductor terminal and the outer conductor terminal are combined and fixed.

2. Background Art

When an inner conductor terminal connected to an inner conductor (also referred to as a "signal conductor") of a coaxial cable and an outer conductor terminal connected to an outer conductor (also referred to as "shield conductor") of the coaxial cable are combined and fixed to form a connector terminal, for example, the following is performed. That is, the inner conductor terminal is connected and fixed in advance to a tip end of the inner conductor of an end portion of the coaxial cable. Next, the inner conductor terminal is inserted into a substantially cylindrical inside of the outer conductor terminal from rear. In this state, the outer conductor terminal is connected and fixed to the outer conductor of the coaxial cable (see Patent Document JP-A-2003-297493).

When the outer conductor terminal and the inner conductor terminal are combined and fixed to form the connector terminal, it is necessary to fix the outer conductor terminal and the inner conductor terminal such that a positional relationship between the outer conductor terminal and the inner conductor terminal is appropriately maintained.

In a related art described in Patent Document 1, the inner conductor terminal is inserted into an inside of a dielectric (solid component) housed inside the outer conductor terminal. Therefore, a position of the inner conductor terminal with respect to the outer conductor terminal can be properly determined by the dielectric.

SUMMARY

When the dielectric (solid component) is not inserted between the outer conductor terminal and the inner conductor terminal, it is difficult to properly maintain the mutual positional relationship between the outer conductor terminal and the inner conductor terminal.

When the dielectric (solid component) is not inserted between the outer conductor terminal and the inner conductor terminal, the outer conductor terminal and the inner conductor terminal may contact each other and become defective depending on an assembly state. Therefore, a quality determination must be separately performed by inspecting a conduction state between the outer conductor terminal and the inner conductor terminal, so that there is also a problem that improvement in productivity is limited due to a process of manually moving the coaxial cable to a device for conduction inspection.

The present invention has been made in view of the above circumstances, and an aspect of the present invention is to provide a terminal state measurement device for a coaxial cable which can efficiently and easily manage mutual positions of an inner conductor terminal connected to an inner conductor of a coaxial cable and an outer conductor terminal connected to an outer conductor of the coaxial cable and can efficiently and easily manage mutual insulation between the inner conductor terminal and the outer conductor terminal.

In order to achieve the above aspect, a terminal state measurement device for a coaxial cable according to the present invention is characterized by the following (1) to (3).
(1) A terminal state measurement device for a coaxial cable comprising:
a conductive cylindrical body which comes close to a front end edge of an outer conductor terminal held and fixed in advance from a front side to bring a front end face of the conductive cylindrical body in the axial direction into contact with the front end edge when the outer conductor terminal is connected and fixed to an outer conductor of an end portion of a coaxial cable;
a conduction measurement element which is housed in an inner periphery of the conductive cylindrical body via an insulating material, which is displaceable with respect to the conductive cylindrical body in an axial direction, and which contacts a front end of an inner conductor terminal connected and fixed to an inner conductor of the end portion of the coaxial cable from the front side to displace in the axial direction in accordance with an insertion position of the inner conductor terminal when the inner conductor terminal is inserted into an inside of the outer conductor terminal from a rear side;
a displacement measurement device which is configured to measure a position of the front end of the inner conductor terminal based on a displacement amount of the conduction measurement element in the axial direction; and
an insulation determination unit which is configured to determine an insulation quality between the inner conductor terminal and the outer conductor terminal based on a conduction state of the conduction measurement element and the conductive cylindrical body.
(2) The terminal state measurement device for a coaxial cable according to above configuration (1),
wherein the insulation determination unit determines the insulation quality between the inner conductor terminal and the outer conductor terminal at any timing from a start of contacting of the front end of the inner conductor terminal with the conduction measurement element to an end of the contacting.
(3) The terminal state measurement device for a coaxial cable according to above configuration (2),
wherein the insulation determination unit determines the insulation quality between the inner conductor terminal and the outer conductor terminal at a timing when the displacement measurement device detects that the front end of the inner conductor terminal is at a proper position.

According to the terminal state measurement device for a coaxial cable having the configuration (1), the front end of the inner conductor terminal can be properly positioned with respect to the outer conductor terminal in the axial direction based on the displacement amount of the conduction measurement element which contacts the front end of the inner conductor terminal. The displacement amount is detected by the displacement measurement device. Further, the conduction measurement element is in contact with the inner conductor terminal and the conductive cylindrical body is in contact with the outer conductor terminal. Therefore, the insulation quality between the inner conductor terminal and the outer conductor terminal can be determined by determining whether the conduction measurement element and the conductive cylindrical body are electrically connected to each other.

That is, when it is detected that the conduction measurement element and the conductive cylindrical body are electrically connected to each other, there is a contact point between the outer conductor terminal and the inner conductor terminal. Therefore, it can be determined that the coaxial cable is defective. When it is detected that the conduction measurement element and the conductive cylindrical body are not electrically connected to each other, the outer conductor terminal and the inner conductor terminal are not in contact with each other. Therefore, it can be determined that the coaxial cable is non-defective.

Therefore, both the mutual positioning of the inner conductor terminal and the outer conductor terminal and the insulation determination between the inner conductor terminal and the outer conductor terminal can be performed using one displacement measurement device. That is, it is not necessary to perform the insulation inspection as a separate process later. Therefore, mutual positions of the inner conductor terminal and the outer conductor terminal and the mutual insulation between the inner conductor terminal and the outer conductor terminal can be managed efficiently and easily, so that productivity can be improved.

According to the terminal state measurement device for a coaxial cable having the configuration (2), the insulation quality of the outer conductor terminal and the inner conductor terminal is determined at any timing from the start of contacting of the front end of the inner conductor terminal with the conduction measurement element to the end of the contacting. Therefore, rapid processing can be performed, so that productivity can be improved.

According to the terminal state measurement device for a coaxial cable having the configuration (3), the insulation quality of the outer conductor terminal and the inner conductor terminal is determined at the timing when the inner conductor terminal is properly positioned with respect to the outer conductor terminal. Therefore, rapid processing can be performed, which facilitates elimination of defective products. Connection processing of the outer conductor terminal immediately after can also be efficiently performed only for products which are determined as non-defective products, so that productivity can be improved.

According to the present invention, the mutual positions of the inner conductor terminal connected to the inner conductor of the coaxial cable and the outer conductor terminal connected to the outer conductor of the coaxial cable and the mutual insulation between the inner conductor terminal and the outer conductor terminal can be managed efficiently and easily, so that productivity can be improved.

The present invention has been briefly described as above. Details of the present invention will be further clarified by reading a mode (hereinafter, referred to as "embodiment") for carrying out the present invention described below with reference to the accompanying drawings.

DETAILED DESCRIPTION OF EMBODIMENTS

A specific embodiment according to the present invention will be described with reference to drawings.

Figure 1:
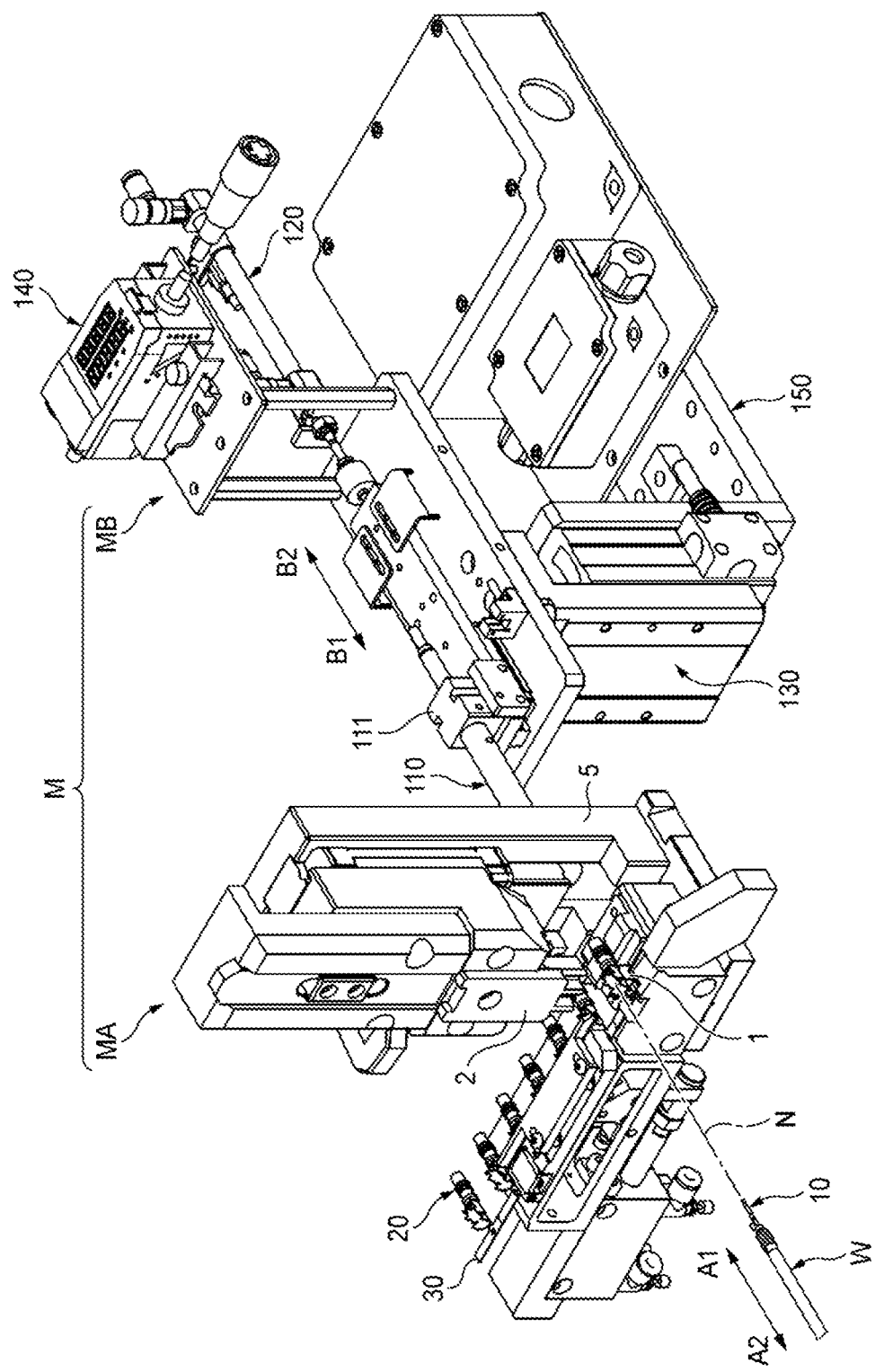
FIG. 1 is a perspective view illustrating an overall configuration of a coaxial cable end processing apparatus in which a measurement device which is a terminal state measurement device for a coaxial cable according to an embodiment of the present invention is combined with a terminal crimping device.

FIG. 1 is a perspective view illustrating an overall configuration of a coaxial cable end processing apparatus M in which a measurement device MB which is a terminal state measurement device for a coaxial cable according to an embodiment is combined with a terminal crimping device MA.

As illustrated in FIG. 1, the coaxial cable end processing apparatus M combines the terminal crimping device MA and the measurement device (terminal state measurement device for a coaxial cable) MB. The terminal crimping device MA includes an anvil (lower mold) 1 and a crimper (upper mold) 2. The terminal crimping device MA performs a necessary cutting process or crimping process on an object to be processed by lowering the crimper 2 on the fixed anvil 1. Here, the object to be processed is an outer conductor terminal 20.

Figure 2:
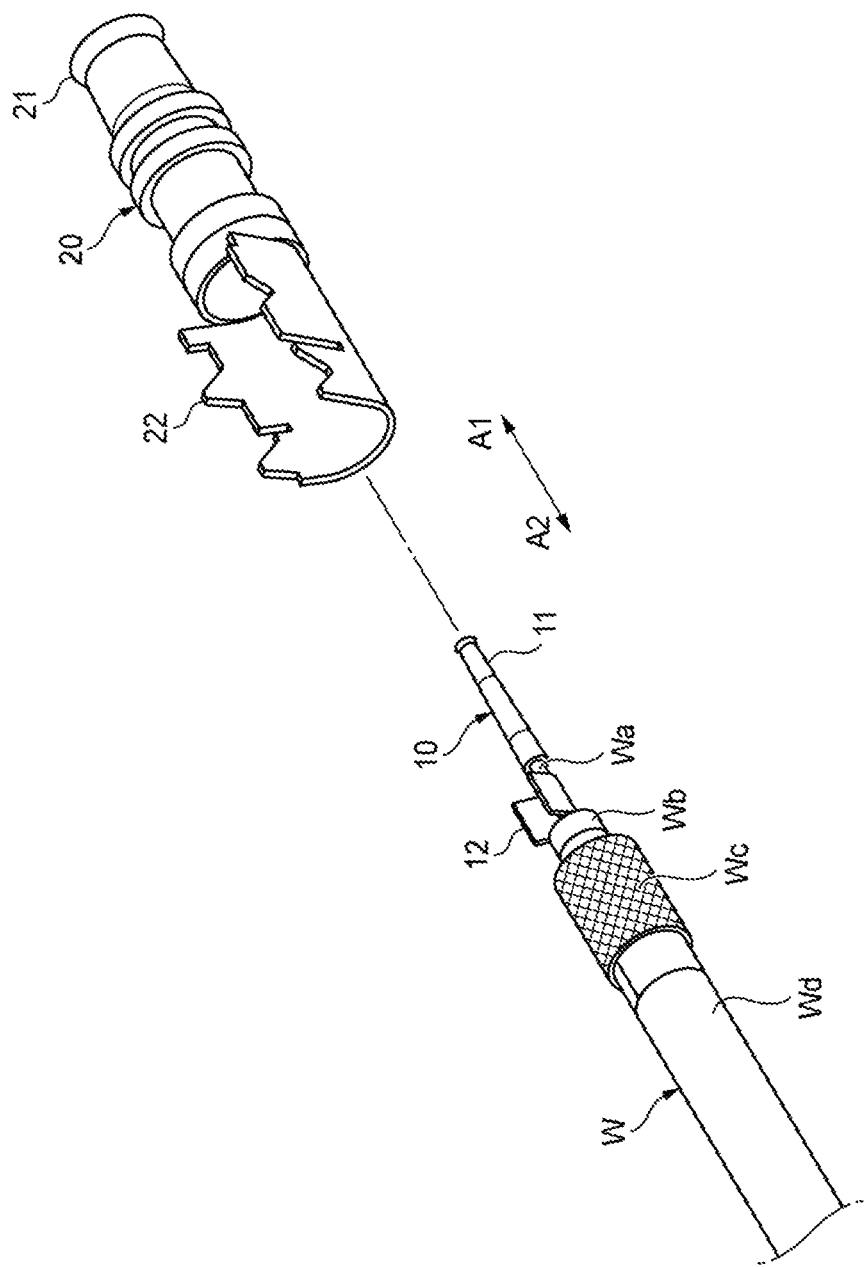
FIG. 2 is a perspective view illustrating configurations of an inner conductor terminal connected and fixed in advance to an end portion of the coaxial cable and an outer conductor terminal to be connected and fixed to the end portion of the coaxial cable.

FIG. 2 is a perspective view illustrating configurations of an inner conductor terminal 10 connected and fixed in advance to an end portion of an coaxial cable and the outer conductor terminal 20. The outer conductor terminal 20 is the object to be processed which is to be connected and fixed to the end portion of the coaxial cable W by the coaxial cable end processing device M in FIG. 1.

First, a configuration of the coaxial cable W will be briefly described with reference to FIG. 2.

The coaxial cable W is a coaxial electric wire including an inner conductor (signal conductor) Wa for signal transmission, an insulator (dielectric) Wb covering a periphery of the inner conductor Wa, an outer conductor (shield conductor) Wc which is a braided wire, an aluminum foil, or the like covering a periphery of the insulator Wb, and an insulating sheath (outer cover) Wd covering an outer periphery of the outer conductor Wc.

Next, the terminals will be briefly described.

The inner conductor terminal 10 and the outer conductor terminal 20 combine to form a coaxial connector. The inner conductor terminal 10 is connected and fixed to the inner conductor Wa of the coaxial cable W. The inner conductor terminal 10 is formed into a substantially cylindrical shape by press bending after a metal plate is punched out, which includes a cylindrical portion 11 on a front end side of the inner conductor terminal 10 and a crimping piece 12 on a rear end side of the inner conductor terminal 10. In this case, the inner conductor terminal 10 includes a female terminal shape, and a male terminal on a mating connector side is inserted into the cylindrical portion 11. Here, in advance, the inner conductor terminal 10 is crimped and connected to a front end of the peeled and exposed inner conductor Wa of the end portion of the coaxial cable W by the crimping piece 12. The inner conductor terminal 10 in FIG. 2 is illustrated as a state before the crimping process.

The outer conductor terminal 20 is formed by press bending after the metal plate is punched out, which includes a cylindrical main body cylindrical portion 21 opened forward and backward on a front side part of the outer conductor terminal 20 and a crimping piece 22 on a rear side of the outer conductor terminal 20. The outer conductor terminal 20 is crimped and connected to the pre-processed outer conductor Wc of the end portion of the coaxial cable W by the crimping piece 12. The pre-processed outer conductor Wc of the end portion of the coaxial cable W is, for example, a portion subjected to a process of turning over the cylindrical outer conductor Wc having a predetermined length and covering the sheath as illustrated in FIG. 2.

The coaxial cable end processing apparatus M illustrated in FIG. 1 performs processing for connecting and fixing the outer conductor terminal 20 to the coaxial cable W after combining the inner conductor terminal 10 attached in advance to the end portion of the coaxial cable W with the outer conductor terminal 20 and performing alignment and predetermined inspection.

The measurement device MB is used for positioning of the inner conductor terminal 10 with respect to the outer conductor terminal 20 and inspection of the insulation between the outer conductor terminal 20 and the inner conductor terminal 10 during the processing.

Specifically, the inner conductor terminal 10 connected and fixed to the front end of the inner conductor Wa of the end portion of the coaxial cable W is inserted into a substantially cylindrical inside of the outer conductor terminal 20 from rear. In this state, the outer conductor terminal 20 is connected and fixed to the outer conductor Wc of the end portion of the coaxial cable W. The measurement device MB is used to measure a relationship between the inner conductor terminal 10 and the outer conductor terminal 20 in the insertion step.

Directionality will be described first with reference to FIG. 1.

A front side (arrow A1 direction in FIG. 1) and a rear side (arrow A2 direction in FIG. 1) is defined for the terminal crimping device MA with reference to the coaxial cable W. The inner conductor terminal 10 is attached to the front end of the coaxial cable W. The inner conductor terminal 10 is fed out forward (in the arrow A1 direction) along an axis of the coaxial cable W from a horizontal direction and inserted into the inside of the outer conductor terminal 20 set on the anvil 1 from a rear side of the outer conductor terminal 20 when the inner conductor terminal 10 is assembled to the outer conductor terminal 20.

Therefore, the outer conductor terminal 20 is set on the terminal crimping device MA such that a rear end side of the outer conductor terminal 20 is directed in a direction in which the inner conductor terminal 10 enters. The plurality of pressed outer conductor terminals 20 are connected in a chain shape by a carrier 30, and are intermittently fed and moved on the anvil 1 in the horizontal direction orthogonal to a direction in which the inner conductor terminal 10 is fed out, that is, in a left-right direction.

The inner conductor terminal 10 is fed out forward along the axis of the coaxial cable W. Hereinafter, the axis, along which the inner conductor terminal 10 is fed out, will be referred to as an operation axis N. The outer conductor terminal 20 to be operated is set on the anvil 1 along the operation axis N. The crimper 2 performs the cutting process or crimping process on the outer conductor terminal 20 set on the operation axis N.

The terminal crimping device MA includes a vertical wall 5 in front of the direction in which the inner conductor terminal 10 is fed out, that is, in front of a position where the anvil 1 is disposed. A drive mechanism of the crimper 2 and the like are supported by the vertical wall 5. Then, The measurement device MB, which is the terminal state measurement device of the coaxial cable according to the embodiment, is disposed in front of the terminal crimping device MA with the vertical wall 5 interposed therebetween.

The measurement device MB is configured around a measurement sensor unit 110.

Figure 3:
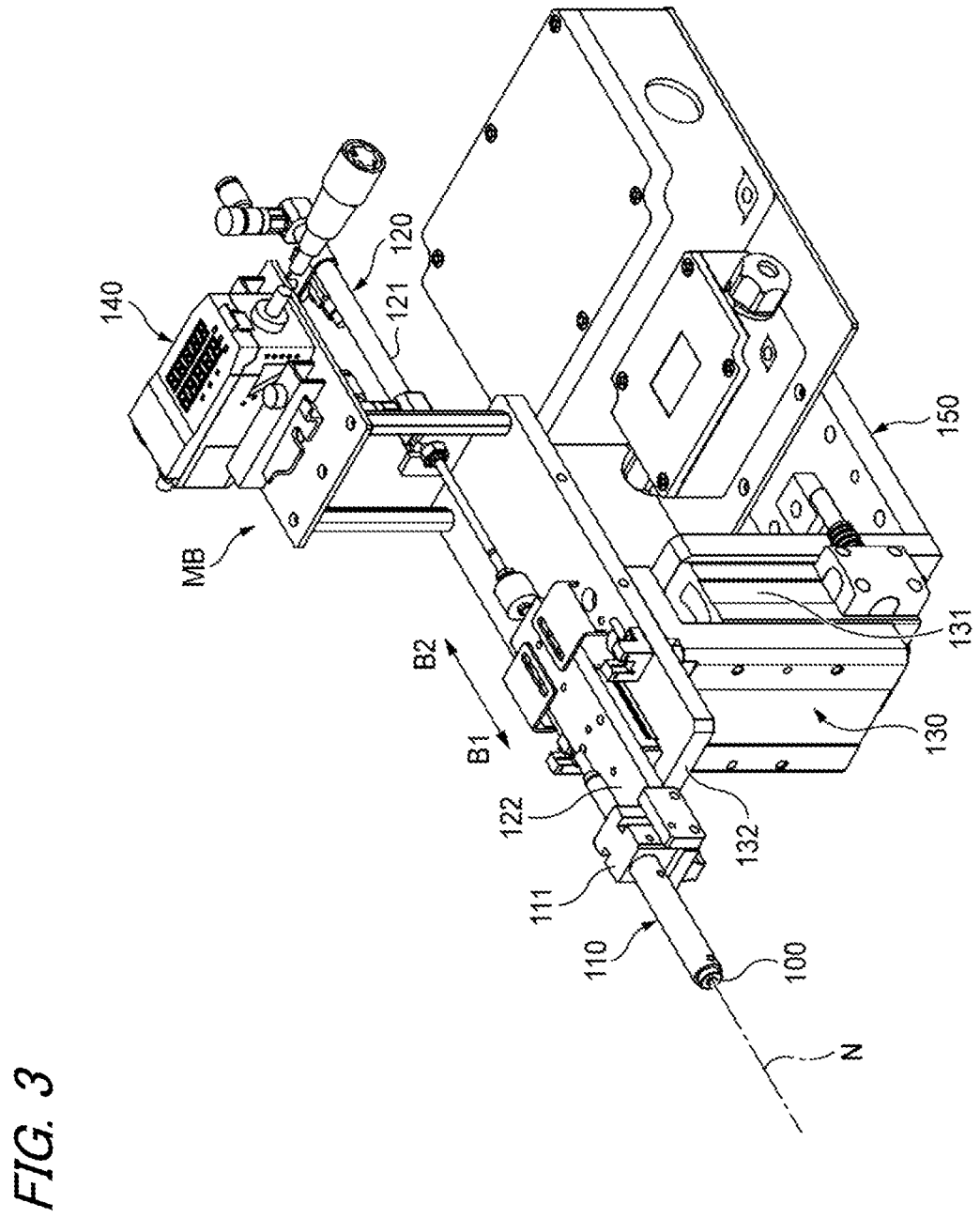
FIG. 3 is a perspective view illustrating an overall configuration of the measurement device.
Figure 4:
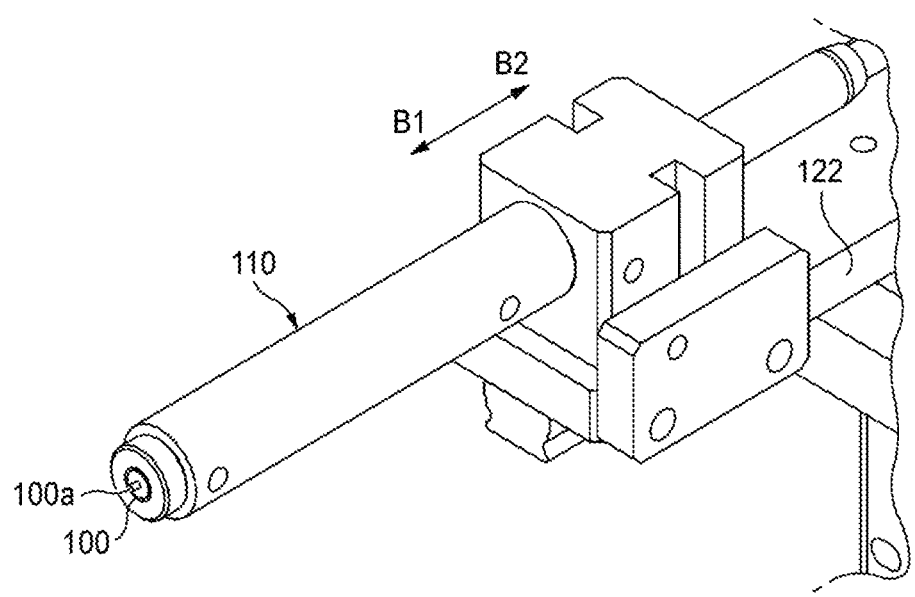
FIG. 4 is a perspective view illustrating an appearance configuration of a measurement sensor unit of the measurement device.

FIG. 3 is a perspective view illustrating an overall configuration of the measurement device MB. FIG. 4 is a perspective view illustrating an appearance configuration of the measurement sensor unit 110 of the measurement device MB.

Hereinafter, the measurement device MB will be described in detail with reference to FIGS. 3 and 4.

A directionality of the measurement device MB is determined based on an operation direction of the measurement device MB. That is, the measurement sensor unit 110, which is finally position-controlled, has a rod shape, and is mounted with an axial direction of the measurement sensor unit 110 being horizontal. The measurement sensor unit 110 is moved in an upper-lower direction so as to be positioned, and is moved forward and rearward in the axial direction so as to be positioned. Therefore, a forward direction of the measurement sensor unit 110 is defined as a front side (arrow B1 direction in FIG. 3) of the measurement device MB, and a rearward direction of the measurement sensor unit 110 is defined as a rear side (arrow B2 direction in FIG. 3) of the measurement device MB. Therefore, it should be noted that the front side and the rear side (the arrow B1 direction and the arrow B2 direction in FIG. 3) are determined with reference to the measurement device M and thus are opposite to the front side and the rear side (the arrow A1 direction and the arrow A2 direction in FIG. 1) of the terminal crimping device MA illustrated in FIG. 1.

As illustrated in FIG. 3, the measurement device MB includes a base plate 150 as a base. A upper-lower movement mechanism 130 is provided at a front end portion (end portion in the arrow B1 direction in FIG. 3) of the base plate 150. The upper-lower movement mechanism 130 is configured to move an upper-lower movement table 132 in the upper-lower direction by an upper-lower movement actuator 131 to position the upper-lower movement table 132.

A front-rear movement mechanism 120 is provided on the upper-lower movement table 132. The front-rear movement mechanism 120 moves a front-rear movement table 122 in a front-rear direction (the arrow B1 direction and the arrow B2 direction in FIG. 3) by a front-rear movement actuator 121 to position the front-rear movement table 122. The front-rear movement actuator 121 is disposed on a rear end side (end portion side in the arrow B2 direction in FIG. 3) of the upper-lower movement table 132, and the front-rear movement table 122 is disposed on a front end side (end portion side in the arrow B1 direction in FIG. 3) of the upper-lower movement table 132.

Then, as illustrated in FIG. 4, the measurement sensor unit 110 is provided on the front-rear movement table 122 via a holder 111. A measurement result display unit 140, which is configured to display measurement data of the measurement sensor unit 110, is provided on a rear end side of the front-rear movement table 122.

At a time of non-measurement, as illustrated in FIG. 1, the measurement sensor unit 110 stands by in front of the vertical wall 5 of the terminal crimping device MA (in front of the terminal crimping device MA=in the arrow A1 direction). At a time of measurement, first, the measurement sensor unit 110 is positioned on an extension of the operation axis N of the terminal crimping device MA. Then, at that position, the measurement sensor unit 110 moves forward (moves forward relative to the measurement device MB=moves in the arrow B1 direction) to bring a front end portion of the measurement sensor unit 110 close to and into contact with the outer conductor terminal 20 on the anvil 1 through a penetrating portion of the vertical wall 5.

Next, a configuration of the measurement sensor unit 110 will be described.

Figure 10:
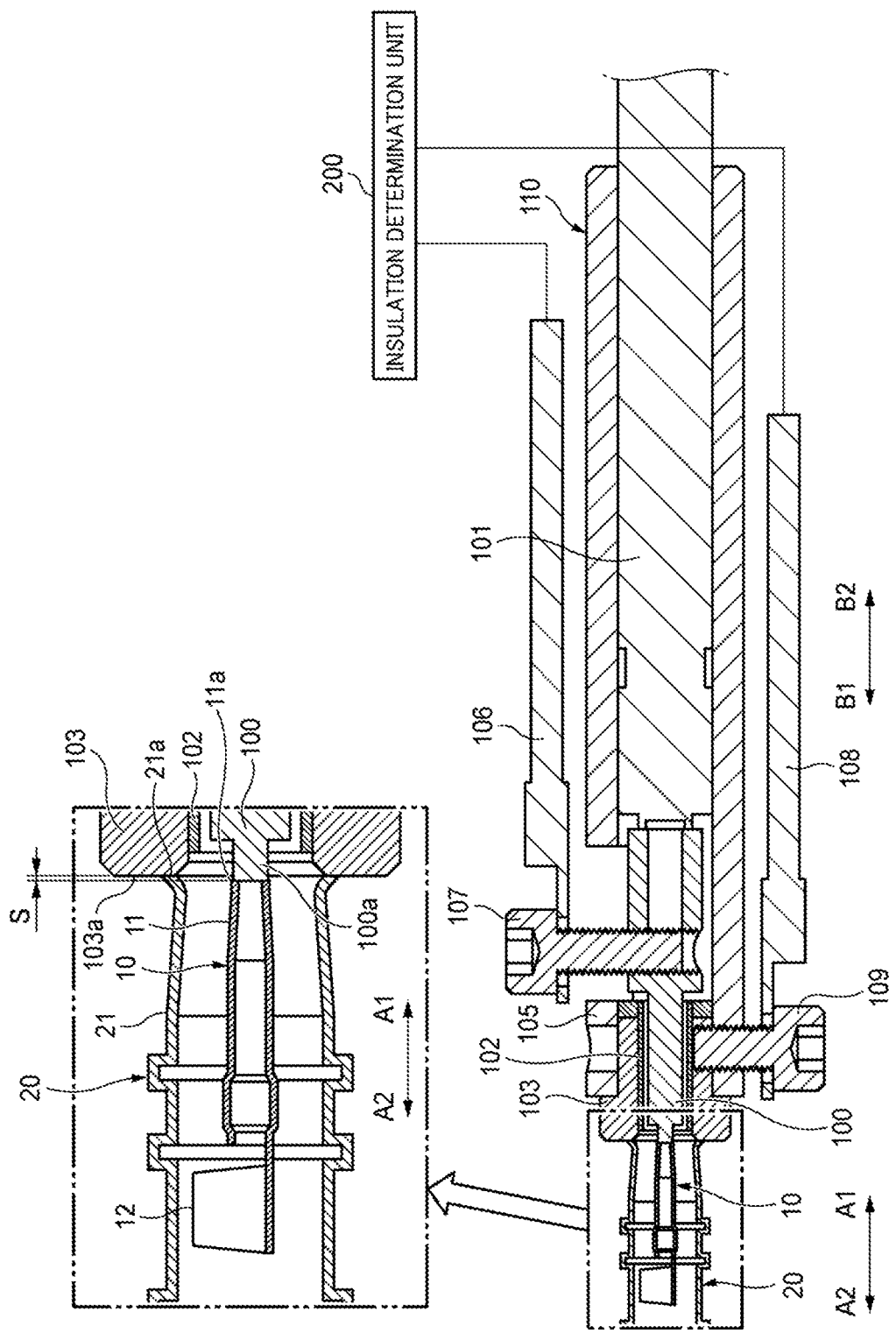
FIG. 10 is a side cross sectional view of a step next to the step in FIG. 9, which illustrates a state where the inner conductor terminal is inserted to a proper position inside the outer conductor terminal, and an enlarged view of a main part thereof.

FIG. 10 is used as a reference drawing. FIG. 10 illustrates details of the configuration of the measurement sensor unit 110 in cross section.

As illustrated in FIG. 10, the measurement sensor unit 110 corresponds to a displacement measurement device, and uses a resin pipe 105 as a central support member. A measurement rod 101 is housed inside the resin pipe 105 so as to be slidable in the axial direction, and a conduction measurement element 100 made of a conductive material which is metal or the like is provided at a front end of the measurement rod 101. A cylindrical metal bush (metal cylindrical body) 103 is fixed to a front end of the resin pipe 105, and the conductive measurement element 100 is housed in the metal bush 103 via an insulating material ring 102 so as to be displaceable in the axial direction. The measurement element 100 is displaced integrally with the measurement rod 101 in the axial direction, so that the measurement sensor unit 110 measures a displacement amount of the measurement element 100 via the measurement rod 101.

The metal bush 103 comes close to a front end edge 21a of the outer conductor terminal 20 held and fixed in advance on the anvil 1 from the front side to bring the front end face 103a of the metal bush 103 in the axial direction into contact with the front end edge 21a.

When the inner conductor terminal 10 is inserted into the inside of the outer conductor terminal 20 from the rear side, the measurement device 100 contacts a front end 11a of the inner conductor terminal 10 from the front side to displace in the axial direction in accordance with an insertion position of the inner conductor terminal 10. The measurement sensor unit 110 is configured to measure a position of the front end of the inner conductor terminal 10 based on the displacement amount of the measurement element 100 in the axial direction. When the displacement amount reaches a predetermined value, a position of a displacement measurement object (in this case, the inner conductor terminal 10) in the axial direction can be determined by restricting a movement of the measurement element 100 or restricting a movement of the displacement measurement object which moves the measurement element 100 by pushing.

For example, the insertion of the inner conductor terminal 10 is stopped at a timing when the front end 11a of the measurement element 100 is positioned forward (in the arrow B1 direction) from the front end edge 21a of the outer conductor terminal 20 by a dimension S (for example, 0.25 mm) with reference to a position of the front end edge 21a of the outer conductor terminal 20 in contact with the front end surface 103a of the metal bush 103. As a result, the front end 11a of the inner conductor terminal 10 can be positioned at a position recessed by the dimension S from the front end edge 21a of the outer conductor terminal 20.

The measurement element 100 and the metal bush 103, which are used as described above, both serve as an electrical detector. That is, a first conductive member (electric wire, metal plate, or the like) 106 is electrically connected to the measurement element 100 via a screw 107. A second conductive member (electric wire, metal plate, or the like) 108 is electrically connected to the metal bush 103 via a screw 109. The first conductive member 106 and the second conductive member 108 are electrically connected to the insulation determination unit 200. The insulation determination unit 200 is configured to detect whether the first conductive member 106 and the second conductive member 108 are electrically connected to each other.

Figure 11:
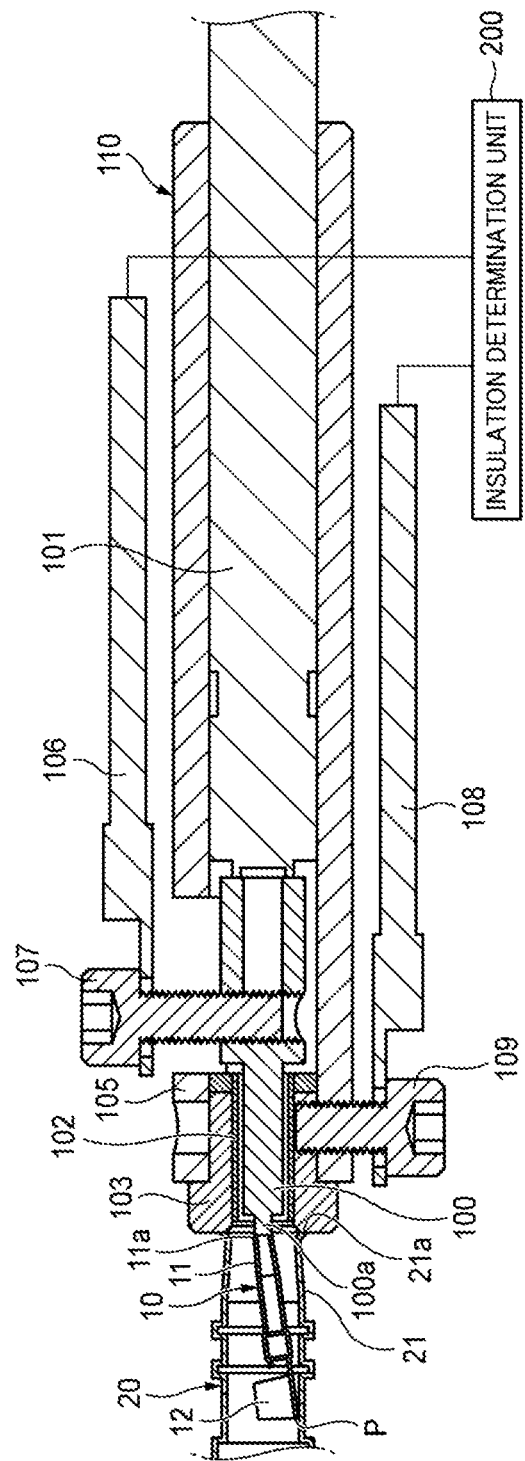
FIG. 11 is a side cross sectional view illustrating an example in which a defect determination is performed based on a detection result that the outer conductor terminal and the inner conductor terminal are in contact with each other and the two terminals are electrically connected to each other at the same timing as in FIG. 10.

When it is detected that the first conductive member 106 and the second conductive member 108 are electrically connected to each other, as illustrated in FIG. 11, it means that the outer conductor terminal 20 and the inner conductor terminal 10 are in contact with each other somewhere. Therefore, it is determined that the insulation is defective, so that it is determined that the coaxial cable W is defective. When it is detected that the first conductive member 106 and the second conductive member 108 are not electrically connected to each other, it means that the outer conductor terminal 20 and the inner conductor terminal 10 are not in contact with each other. Therefore, it is determined that the insulation is good, so that it is determined that the coaxial cable W is non-defective. This determination may be performed at any timing when the measurement element 100 is in contact with the inner conductor terminal 10 and the metal bush 103 is in contact with the outer conductor terminal 20. However, this determination may be simultaneously performed at a timing when the measurement sensor unit 110 positions the inner conductor terminal 10 (that is, a timing when it is detected that the front end of the inner conductor terminal is at a proper position).

Next, a series of steps will be described with reference to FIGS. 5 to 13.

Figure 5:
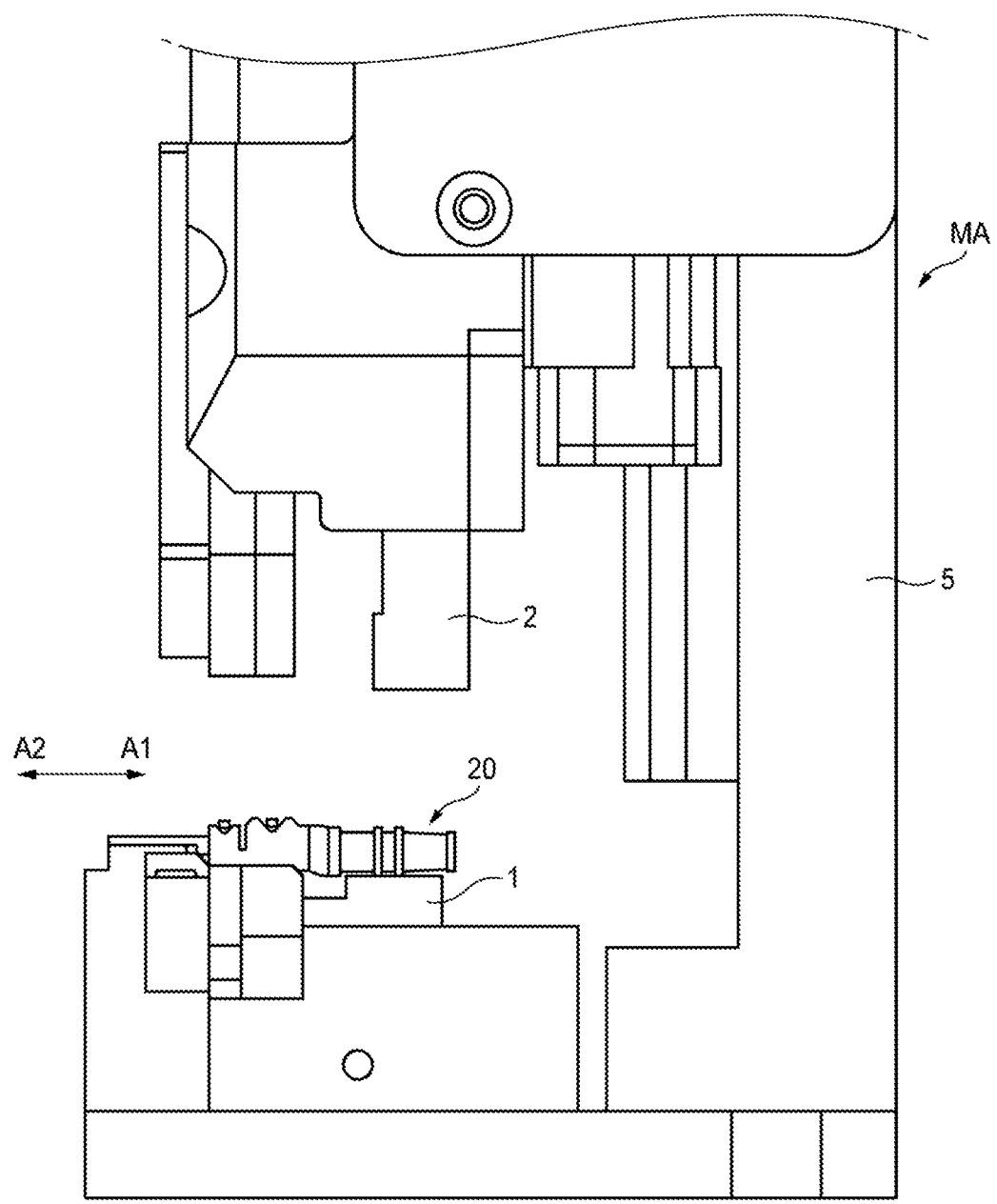
FIG. 5 is an enlarged side view of a processing step of the coaxial cable end processing apparatus, which illustrates a state where the outer conductor terminal is set on an anvil.
Figure 6:
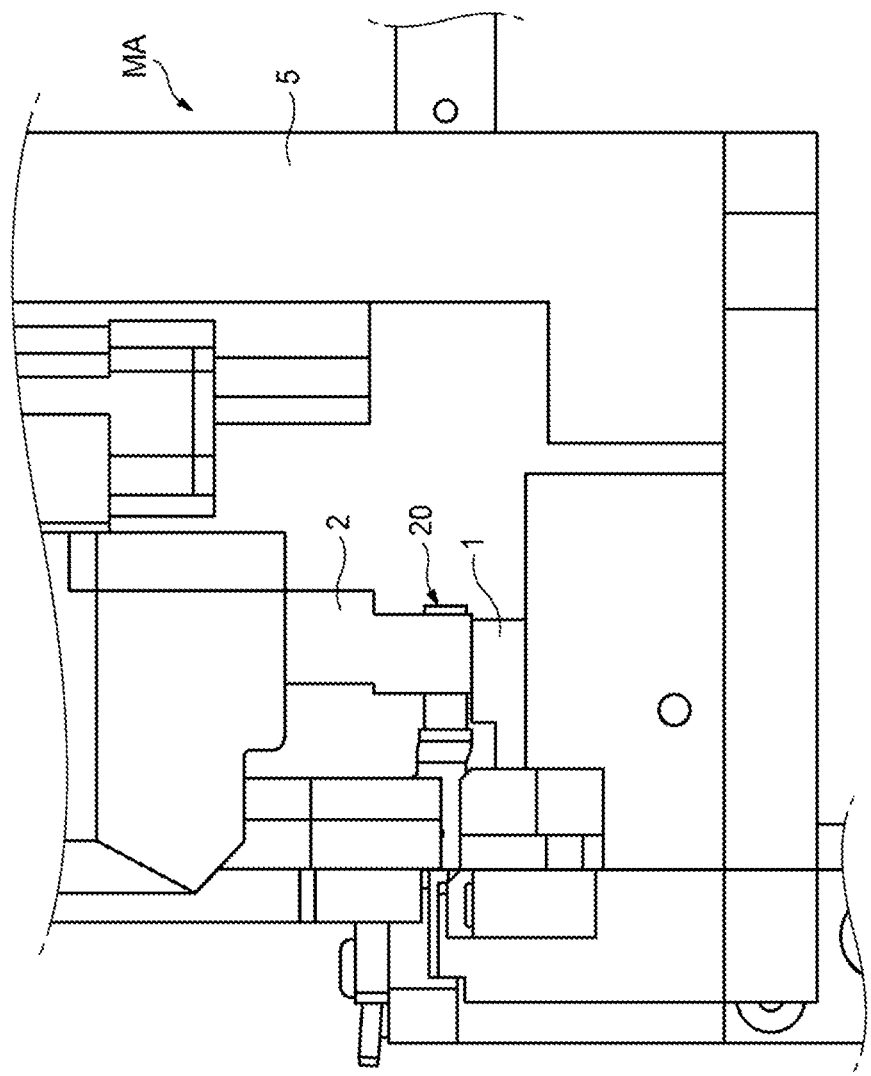
FIG. 6 is an enlarged side view of a step next to the step in FIG. 5, which illustrates a state where the outer conductor terminal set on the anvil is pushed by a crimper.
Figure 7:
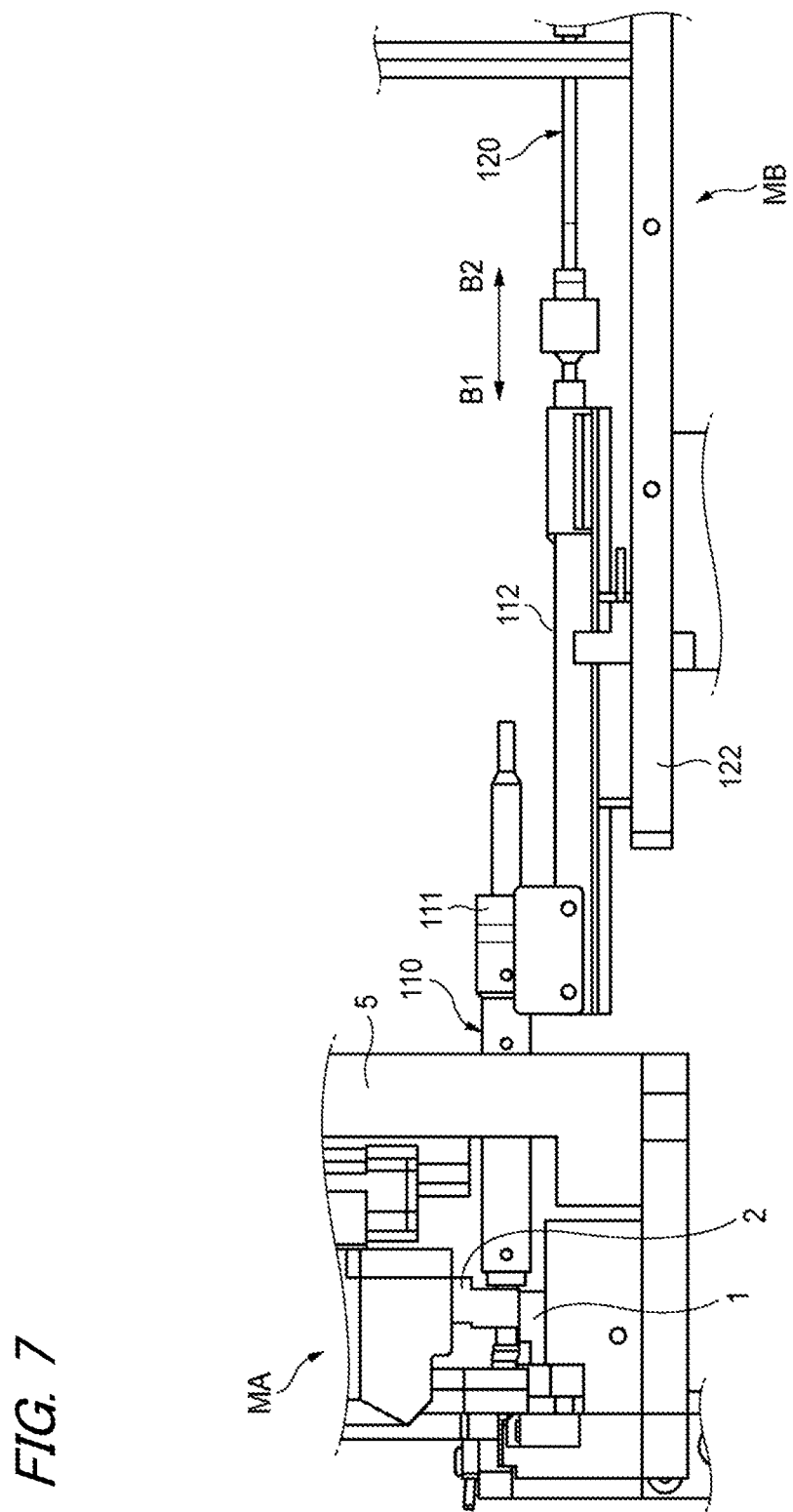
FIG. 7 is a side view of a step next to the step in FIG. 6, which illustrates a state where the measurement sensor unit is brought close to and brought into contact with a front end of the outer conductor terminal pushed by the crimper from a front side.
Figure 8:
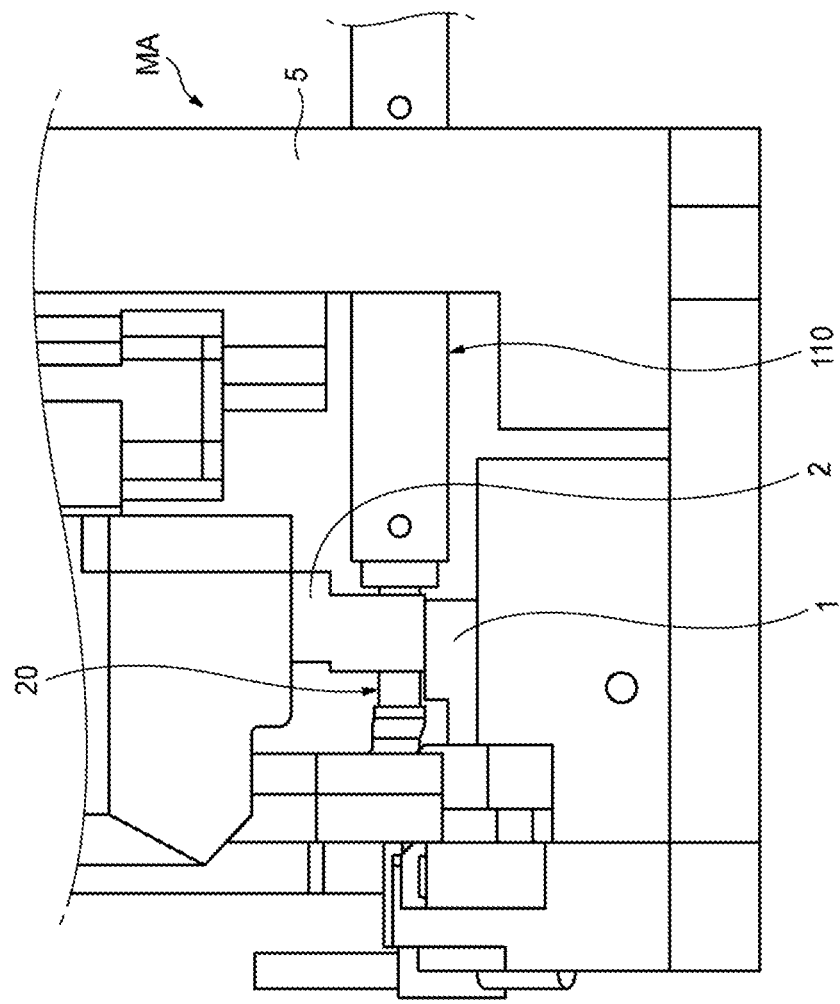
FIG. 8 is an enlarged side view of a main part in FIG. 7.
Figure 9:
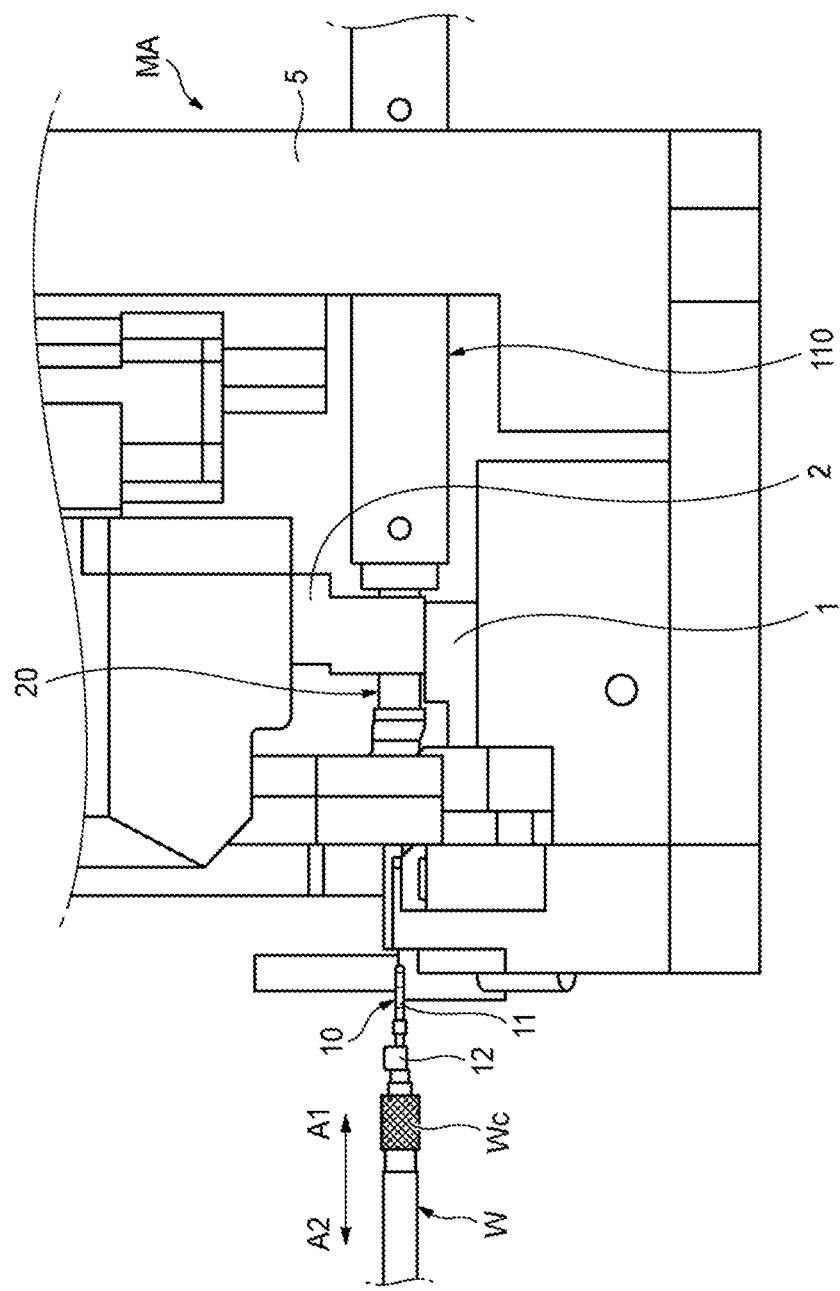
FIG. 9 is an enlarged side view of a step next to the step in FIG. 8, which illustrates a state where the inner conductor terminal which is connected and fixed in advance to the end portion of the coaxial cable is to be inserted into an inside of the outer conductor terminal from a rear side.
Figure 12:
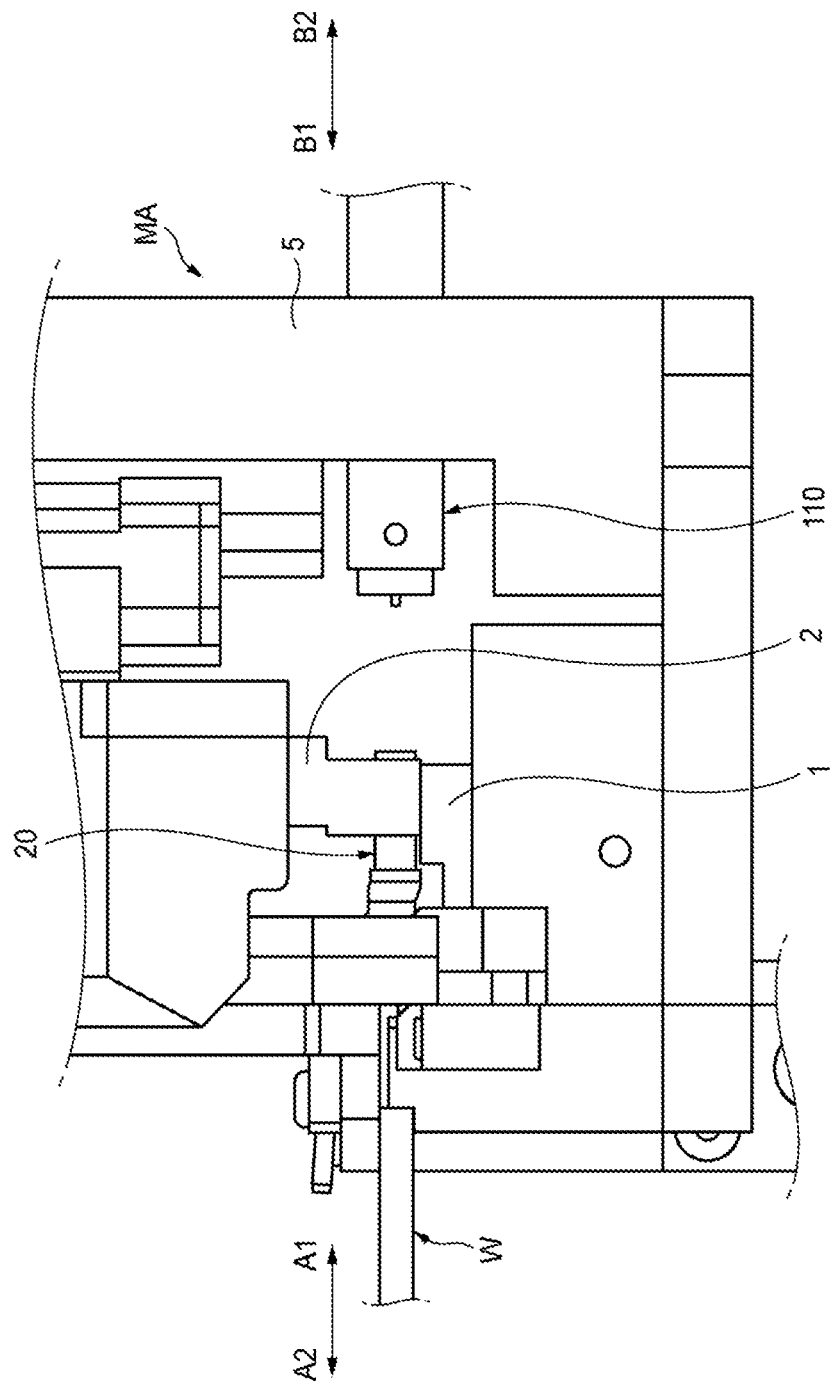
FIG. 12 is an enlarged side view of a step next to the step in FIG. 9, which illustrates a state when the outer conductor terminal is connected and fixed to the coaxial cable such that the measurement sensor unit is retracted.
Figure 13:
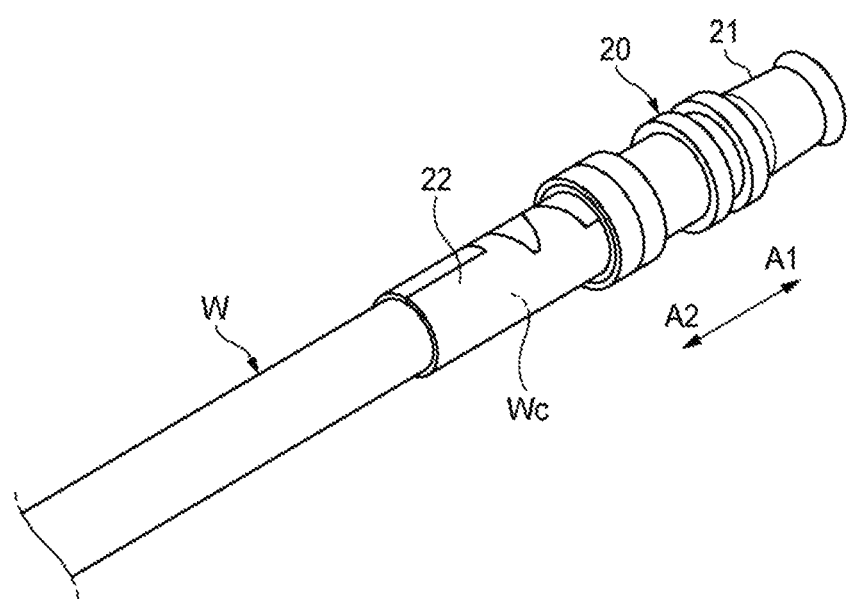
FIG. 13 is an external perspective view of an end processing unit of the finished coaxial cable obtained after the step in FIG. 12 is performed.

FIG. 5 is an enlarged side view of a processing step of the coaxial cable end processing apparatus M, which illustrates a state where the outer conductor terminal 20 is set on the anvil 1. FIG. 6 is an enlarged side view of a step next to the step in FIG. 5, which illustrates a state where the outer conductor terminal 20 set on the anvil 1 is pushed by the crimper 2. FIG. 7 is a side view of a step next to the step in FIG. 6, which illustrates a state where the measurement sensor unit 110 is brought close to and brought into contact with the front end of the outer conductor terminal 20 pushed by the crimper 2 from the front side. FIG. 8 is an enlarged side view of a main part in FIG. 7. FIG. 9 is an enlarged side view of a step next to the step in FIG. 8, which illustrates a state where the inner conductor terminal 10 which is connected and fixed in advance to the end portion of the coaxial cable W is to be inserted into the inside of the outer conductor terminal 20 from the rear side. FIG. 10 is a side cross sectional view of a step next to the step in FIG. 9, which illustrates a state where the inner conductor terminal 10 is inserted to a proper position inside the outer conductor terminal 20, and an enlarged view of a main part thereof. FIG. 11 is a side cross sectional view illustrating an example in which a defect determination is performed based on a detection result that the outer conductor terminal 20 and the inner conductor terminal 10 are in contact with each other and the two terminals 20, 10 are electrically connected to each other at the same timing as in FIG. 10. FIG. 12 is an enlarged side view of a step next to the step in FIG. 9, which illustrates a state when the outer conductor terminal 20 is connected and fixed to the coaxial cable W such that the measurement sensor unit 110 is retracted. FIG. 13 is an external perspective view of an end processing unit of the finished coaxial cable W obtained after the step in FIG. 12 is performed.

At a time of processing, first, as illustrated in FIG. 5, the outer conductor terminal 20 to be processed is supplied onto the anvil 1. As illustrated in FIG. 6, the crimper 2 is lowered to clamp and fix the outer conductor terminal 20 by the anvil 1 and the crimper 2. At this time, the carrier 30 (see FIG. 1) is cut to separate the outer conductor terminal 20 on the anvil 1 from the chain.

Next, as illustrated in FIGS. 7 and 8, the measurement device MB is operated to advance the measurement sensor unit 110 to a measurement position. That is, as illustrated in FIG. 10, the front end surface 103a of the metal bush 103 is abutted against the front end edge 21a of the outer conductor terminal 20. At this step, a front end 100a of the measurement element 100 protrudes to a position where the front end of the inner conductor terminal 10 is inserted.

Next, as illustrated in FIG. 9, the inner conductor terminal 10, which is attached to the front end of the coaxial cable W, is inserted into the inside of the outer conductor terminal 20 from the rear side of the outer conductor terminal 20.

When the inner conductor terminal 10 is inserted into the inside of the outer conductor terminal 20, the front end 11a of the inner conductor terminal 10 abuts against the front end 100a of the measurement element 100 to move the measurement element 100 by pushing. The measurement sensor unit 110 reads the displacement amount of the measurement element 100 at this time to measure an insertion amount of the inner conductor terminal 10.

As illustrated in FIG. 10, a position where the insertion amount reaches a predetermined value is determined as a proper insertion position, so that the insertion of the inner conductor terminal 10 is stopped. As a result, the inner conductor terminal 10 can be positioned in the axial direction with respect to the outer conductor terminal 20. At the same time, the insulation determination unit 200 detects a conduction state of the measurement element 100 and the metal bush 103 to determine a insulation quality of the inner conductor terminal 10 and the outer conductor terminal 20.

When it is detected that the measurement element 100 and the metal bush 103 are electrically connected to each other, as illustrated in FIG. 11, it means that the outer conductor terminal 20 and the inner conductor terminal 10 are in contact with each other somewhere. Therefore, it is determined that the insulation is defective, so that it is determined that the coaxial cable W is defective. When it is detected that the measurement element 100 and the metal bush 103 are not electrically connected to each other, as illustrated in FIG. 10, it means that the outer conductor terminal 20 and the inner conductor terminal 10 are not in contact with each other. Therefore, it is determined that the insulation is good, so that it is determined that the coaxial cable W is non-defective.

When it is determined that the coaxial cable W is non-defective, as illustrated in FIG. 12, the measurement sensor unit 110 is retracted to stand by at a retracted position. Then, the crimper 2 is lowered to the final position, and the outer conductor terminal 20 is connected and fixed to the outer conductor Wc of the coaxial cable W. As a result, a final product as illustrated in FIG. 13 is obtained. When it is determined that the coaxial cable W is defective, the coaxial cable W can be eliminated from the apparatus at that step. After the outer conductor terminal 20 is connected and fixed to the outer conductor Wc of the coaxial cable W, the conduction state may be detected again by the insulation determination unit 200.

As described above, according to the above-described measurement device (terminal state measurement device for a coaxial cable) MB, both mutual positioning of the inner conductor terminal 10 and the outer conductor terminal 20 and insulation determination between the inner conductor terminal 10 and the outer conductor terminal 20 can be performed by using the measurement element 100 and the metal bush 103 of one measurement sensor unit 110. That is, it is not necessary to perform the insulation inspection again later. Therefore, mutual positions of the inner conductor terminal 10 and the outer conductor terminal 20 and the mutual insulation between the inner conductor terminal 10 and the outer conductor terminal 20 can be managed efficiently and easily, so that productivity can be improved.

In particular, at a timing when the inner conductor terminal 10 is properly positioned with respect to the outer conductor terminal 20, rapid processing can be performed by determining the insulation quality of the inner conductor terminal 10 and the outer conductor terminal 20, which facilitates elimination of defective products. Therefore, connection processing of the outer conductor terminal 20 immediately after can be efficiently performed only for products which are determined as non-defective products, so that productivity can be improved.

Here, features of the terminal state measurement device for a coaxial cable according to the embodiment of the present invention described above will be briefly summarized in following [1] to [3].

[1] A terminal state measurement device (MB) for a coaxial cable including:

a conductive cylindrical body (103) which comes close to a front end edge (21a) of an outer conductor terminal (20) held and fixed in advance from a front side to bring a front end face of the conductive cylindrical body (103) in the axial direction into contact with the front end edge (21a) when the outer conductor terminal (20) is connected and fixed to an outer conductor (Wc) of an end portion of a coaxial cable (W);

a conduction measurement element (100) which is housed in an inner periphery of the conductive cylindrical body (103) via an insulating material (insulating material ring 102), which is displaceable with respect to the conductive cylindrical body (103) in an axial direction, and which contacts a front end of an inner conductor terminal (10) connected and fixed to an inner conductor (Wa) of the end portion of the coaxial cable (W) from the front side to displace in the axial direction in accordance with an insertion position of the inner conductor terminal (10) when the inner conductor terminal (10) is inserted into an inside of the outer conductor terminal (20) from a rear side;

a displacement measurement device (110) which is configured to measure a position of the front end of the inner conductor terminal (10) based on a displacement amount of the conduction measurement element (100) in the axial direction; and an insulation determination unit (200) which is configured to determine an insulation quality between the inner conductor terminal (10) and the outer conductor terminal (20) based on a conduction state of the conduction measurement element (100) and the conductive cylindrical body.

[2] The terminal state measurement device (MB) for a coaxial cable according to [1], in which the insulation determination unit (200) determines the insulation quality between the inner conductor terminal (10) and the outer conductor terminal (20) at any timing from a start of contacting of the front end (11*a*) of the inner conductor terminal (10) with the conduction measurement element (100) to an end of the contacting.

[3] The terminal state measurement device (MB) for a coaxial cable according to [2], in which the insulation determination unit (200) determines the insulation quality between the inner conductor terminal (10) and the outer conductor terminal (20) at a timing when the displacement measurement device (110) detects that the front end (11*a*) of the inner conductor terminal (10) is at a proper position.

What is claimed is:

1. A terminal state measurement device for a coaxial cable comprising:

a conductive cylindrical body which comes close to a front end edge of an outer conductor terminal held and fixed in advance from a front side to bring a front end face of the conductive cylindrical body in the axial direction into contact with the front end edge when the outer conductor terminal is connected and fixed to an outer conductor of an end portion of a coaxial cable;

a conduction measurement element which is housed in an inner periphery of the conductive cylindrical body via an insulating material, which is displaceable with respect to the conductive cylindrical body in an axial direction, and which contacts a front end of an inner conductor terminal connected and fixed to an inner conductor of the end portion of the coaxial cable from the front side to displace in the axial direction in accordance with an insertion position of the inner conductor terminal when the inner conductor terminal is inserted into an inside of the outer conductor terminal from a rear side;

a displacement measurement device which is configured to measure a position of the front end of the inner conductor terminal based on a displacement amount of the conduction measurement element in the axial direction; and an insulation determination unit which is configured to determine an insulation quality between the inner conductor terminal and the outer conductor terminal based on a conduction state of the conduction measurement element and the conductive cylindrical body.

2. The terminal state measurement device for a coaxial cable according to claim 1, wherein the insulation determination unit determines the insulation quality between the inner conductor terminal and the outer conductor terminal at any timing from a start of contacting of the front end of the inner conductor terminal with the conduction measurement element to an end of the contacting.

3. The terminal state measurement device for a coaxial cable according to claim 2, wherein the insulation determination unit determines the insulation quality between the inner conductor terminal and the outer conductor terminal at a timing when the displacement measurement device detects that the front end of the inner conductor terminal is at a proper position.

* * * * *